US012630441B2

(12) United States Patent
Jo et al.

(10) Patent No.: US 12,630,441 B2
(45) Date of Patent: *May 19, 2026

(54) TERNARY PARAELECTRIC MATERIAL WITH SPACE GROUP Cc AND METHOD OF MANUFACTURING THE SAME

(71) Applicant: Samsung Electronics Co., Ltd., Suwon-si (KR)

(72) Inventors: Giyoung Jo, Suwon-si (KR); Chan Kwak, Yongin-si (KR); Hyungjun Kim, Suwon-si (KR); Euncheol Do, Seoul (KR); Hyeoncheol Park, Hwaseong-si (KR); Changsoo Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/074,806

(22) Filed: Mar. 10, 2025

(65) Prior Publication Data

US 2025/0206633 A1 Jun. 26, 2025

Related U.S. Application Data

(63) Continuation of application No. 18/356,287, filed on Jul. 21, 2023, now Pat. No. 12,269,753, which is a
(Continued)

(30) Foreign Application Priority Data

Oct. 23, 2019 (KR) ........................ 10-2019-0132390

(51) Int. Cl.
*C04B 35/495* (2006.01)
*C01G 33/00* (2006.01)
(Continued)

(52) U.S. Cl.
CPC ........ *C01G 33/006* (2013.01); *C04B 35/6261* (2013.01); *C04B 35/62695* (2013.01);
(Continued)

(58) Field of Classification Search
CPC .......... C04B 35/6261; C04B 35/62695; C04B 35/645; C04B 35/495; C04B 2235/608;
(Continued)

(56) References Cited

U.S. PATENT DOCUMENTS 11,858,829 B2    1/2024    Jo et al.
12,269,753 B2 *  4/2025    Jo ........................ C04B 35/495
(Continued)

FOREIGN PATENT DOCUMENTS

JP             4355084 B2    10/2009

OTHER PUBLICATIONS

Lena Jahnberg, "Crystal structures of Na2Nb4O11 and CaTa4O11," Journal of Solid State Chemistry 1, pp. 454-462, issued on 1970.
(Continued)

*Primary Examiner* — Matthew E. Hoban
*Assistant Examiner* — Lynne Edmondson
(74) *Attorney, Agent, or Firm* — Harness, Dickey & Pierce, P.L.C.

(57) ABSTRACT

A ternary paraelectric having a Cc structure and a method of manufacturing the same are provided. The ternary paraelectric having a Cc structure includes a material having a chemical formula of $A_2B_4O_{11}$ that has a monoclinic system, is a space group No. 9, and has a dielectric constant of 150 to 250, wherein "A" is a Group 1 element, and "B" is a Group 5 element. "A" may include one of Na, K, Li and Rb. "B" may include one of Nb, V, and Ta. The $A_2B_4O_{11}$ material may be $Na_2Nb_4O_{11}$ in which bandgap energy thereof is
(Continued)

greater than that of STO. The $A_2B_4O_{11}$ material may have relative density that is greater than 90% or more.

20 Claims, 15 Drawing Sheets

Related U.S. Application Data continuation of application No. 16/819,571, filed on Mar. 16, 2020, now Pat. No. 11,858,829.

(51) Int. Cl.

| | |
|---|---|
| *C04B 35/626* | (2006.01) |
| *C04B 35/645* | (2006.01) |
| *H10B 12/00* | (2023.01) |
| *H10D 1/68* | (2025.01) |

(52) U.S. Cl.
CPC .......... *C04B 35/645* (2013.01); *H10B 12/37* (2023.02); *H10D 1/68* (2025.01); *C01P 2002/72* (2013.01); *C01P 2002/76* (2013.01); *C01P 2006/10* (2013.01); *C01P 2006/40* (2013.01)

(58) Field of Classification Search
CPC .......... C04B 2235/666; C04B 2235/77; C04B 2235/3201; C04B 2235/3239; C04B 2235/3251; C04B 2235/76; C01G 33/00; C01P 2002/72; C01P 2002/76; H10D 1/68

See application file for complete search history.

(56) References Cited

U.S. PATENT DOCUMENTS

| | | |
|---|---|---|
| 2012/0091389 A1 | 4/2012 | Madaro et al. |
| 2012/0205321 A1 | 8/2012 | Lau et al. |

OTHER PUBLICATIONS

Nahum Maso, et al., "A new family of ferroelectric materials: Me2Nb4O11," Journal of Materials Chemistry, pp. 2082-2084, published on Feb. 10, 2010.

Nahum Maso, et al., "Polymorphism, structural characterisation and electrical properties of Na2Nb4O11," Journal of Materials Chemistry, pp. 12096-12102, published on Jul. 11, 2011.

Oliveira et al., "Impedance Spectroscopy study of Na2Nb4O11 ceramic matrix by the addition of Bi2O3", Journal of Alloys and Compounds 584, pp. 295-302, Sep. 10, 2013.

Mclamb et al., "Flux Growth of Single-Crystal Na2Ta4O11 Particles and their Photocatalytic Hydrogen Production", Crystal Growth and Design 13, pp. 2322-2326, Apr. 26, 2013.

Non-Final Office Action issued Jan. 30, 2023 in U.S. Appl. No. 16/819,571.

Notice of Allowance issued Apr. 26, 2023 in U.S. Appl. No. 16/819,571.

"International Tables for Crystallography, vol. A: Space-Group Symmetry", the International Union of Crystallography by Springer, 2005.

Maso et al., "Polymorphism, structural characterisation and electrical properties of Na2Nb4O11", J. Mater.Chem., pp. 12096-12102, Jul. 11, 2011 (Year: 2011).

Non-Final Office Action issued Mar. 28, 2024 in U.S. Appl. No. 18/356,287.

Final Office Action issued Sep. 24, 2024 in U.S. Appl. No. 18/356,287.

Notice of Allowance issued Dec. 11, 2024 in U.S. Appl. No. 18/356,287.

* cited by examiner

TERNARY PARAELECTRIC MATERIAL WITH SPACE GROUP Cc AND METHOD OF MANUFACTURING THE SAME

CROSS-REFERENCE TO RELATED APPLICATIONS

This application is a Continuation of U.S. application Ser. No. 18/356,287, filed on Jul. 21, 2023, which is a Continuation of U.S. application Ser. No. 16/819,571, filed on Mar. 16, 2020, now, U.S. Pat. No. 11,858,829, which claims the benefit of Korean Patent Application No. 10-2019-0132390, filed on Oct. 23, 2019, in the Korean Intellectual Property Office, the disclosures of each of which are incorporated herein in its entirety by reference.

BACKGROUND

1. Field

The present disclosure relates to a dielectric material and a method of manufacturing the same, and more particularly, to a ternary paraelectric having a monoclinic crystal with a base-centered Cc lattice structure ("Cc structure") that may be used in an electronic device, such as a semiconductor device, and a method of manufacturing the same.

2. Description of Related Art

As the degree of integration of semiconductor devices increases, the size of the components constituting the semiconductor devices also decreases. For example, in the case of dynamic random access memory (DRAM), as the degree of integration increases, the thickness of the dielectric used in the DRAM also becomes thinner. However, the smaller the thickness of a dielectric in the semiconductor device, the greater the chance of leakage current. Accordingly, as the integration of DRAM increases, the possibility of leakage current may increase. Thus, a relatively high capacitance value is beneficial for stable operation of a highly integrated DRAM.

According to a well-known capacitance formula, the larger the dielectric constant and the smaller the thickness of a dielectric, the higher the capacitance.

However, as described above, if the thickness of the dielectric is small, the possibility of leakage current increases. Therefore, a dielectric having a high dielectric constant and minimizing leakage current according to small thickness is beneficial for highly integrated DRAM.

SUMMARY

Provided are ternary paraelectrics having a Cc structure that has a high dielectric constant and may reduce or minimize side effects (for example, leakage current) due to thinning of a thin film.

Provided are ternary paraelectrics having a Cc structure having a high dielectric constant and relatively large bandgap energy.

Provided are methods of manufacturing the ternary paraelectrics having a Cc structure.

Additional aspects will be set forth in part in the description which follows and, in part, will be apparent from the description, or may be learned by practice of the presented embodiments of the disclosure.

According to an aspect of an embodiment, a ternary paraelectric having a Cc structure includes a material having a chemical formula of $A_2B_4O_{11}$ that belongs to a monoclinic system, is a space group No. 9, and has a dielectric constant of 150 to 250, wherein "A" is a Group 1 element, and B" is a Group 1 element.

"A" may include one of Na, K, Li and Rb. "B" may include one of Nb, V, and Ta.

The $A_2B_4O_{11}$ material may be $Na_2Nb_4O_{11}$ in which a bandgap energy thereof is greater than that of $SrTiO_3$ (STO).

The $A_2B_4O_{11}$ material may have a relative density with respect to an ideal $A_2B_4O_{11}$ of 90% or more.

According to an aspect of an embodiment, a method of manufacturing a ternary paraelectric having a Cc structure, the method comprising: preparing ternary dielectric powder, the ternary dielectric powder comprising a $A_2B_4O_{11}$ material; compacting the prepared powder; and sintering the compacted powder; wherein "A" is a Group 1 element, and "B" is a Group 5 element.

The method may further include re-heat treating a sintered resultant product of the sintering operation.

The sintering may comprise a spark plasma sintering (SPS) operation.

The re-heat treating may be performed at a higher temperature than the sintering operation.

The preparing of the ternary dielectric powder may include: mixing a first precursor including "A" and a second precursor including "B"; milling the mixture of first and second precursors after adding a solvent to the mixture; drying a resultant product after the milling operation is completed; and calcining the dried resultant product.

The milling may comprise a planetary milling operation.

The compacting may comprise molding the ternary dielectric powder into a pellet shape; and compacting the molded ternary dielectric powder.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
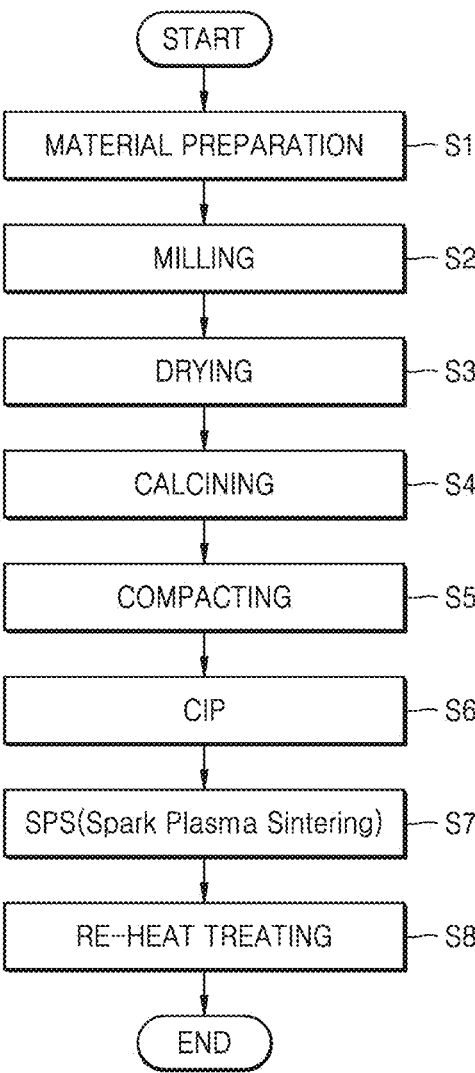
FIG. 1 is a flowchart illustrating a method of manufacturing $Na_2Nb_4O_{11}$, which is an example of a ternary paraelectric having a Cc structure, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

A dielectric material having a higher dielectric constant than the present one and reducing or minimizing side effects (for example, leakage current) due to reduction of film thickness is beneficial for next-generation semiconductor devices (for example, DRAM).

Accordingly, research has been actively conducted to search for next generation dielectric materials with a ternary composition. An example of a next generation dielectric material may be strontium titanate (STO). STO has a relatively high dielectric constant of about 300 but has low bandgap energy of about 3 eV, and thus, a leakage current may increase when a thin film dielectric is formed of STO.

In general, the dielectric constant value and the band gap energy value have an inverse relationship, and thus, as a next-generation dielectric material, a ternary paraelectric having a high dielectric constant value of several hundreds and a band gap energy value larger than that of STO is required.

Thus, $Na_2Nb_4O_{11}$ having a monoclinic crystal structure and a dielectric constant of Space group (S.G.) No. 9 of about 193 was discovered.

Hereinafter, a method of manufacturing a ternary paraelectric having a Cc structure and physical properties of the ternary paraelectric having a Cc structure formed by the method will be described in detail with reference to the accompanying drawings. For example, the method may be directed to the manufacture of the ternary paraelectric as described above.

FIG. 1 is a flowchart showing operations of a method (hereinafter, a first method) of manufacturing $Na_2Nb_4O_{11}$, which is an example of a ternary paraelectric having a Cc structure, according to an embodiment.

Referring to FIG. 1, the first method includes a material preparation operation S1, a milling operation S2, a drying operation S3, a calcining operation S4, a compacting operation S5, a cold isostatic pressing (CIP) operation S6, a spark plasma sintering (SPS) operation S7, and a re-heat treating operation S8.

The first method may be a solid state reaction method. The first method may include a part of a solid phase method (for example, the material preparing operation S1 to the CIP operation S6). However, the embodiment is not limited as such, and the first method may be different from the solid phase method.

In the material preparing operation S1 of the first method, a first precursor and a second precursor may be mixed at a given ratio. The first precursor may be a precursor of Na, and the second precursor may be a precursor of Nb. In an example, the first precursor may be $Na_2CO_3$, and the second precursor may be $Nb_2O_5$. The first and second precursors may be mixed in a ratio of 1:2.

In the milling operation S2, milling includes adding a solvent to a mixture from the previous operation S1. The milling may be, for example, planetary milling. The solvent may be, for example, ethanol. The planetary milling may use revolving and rotating zirconia balls. Through the planetary milling, the mixture from the material preparing operation S1 may be pulverized, and thus, the first and second precursors may be uniformly mixed. The milling operation S2 may be performed for, for example, about 12 hours.

The drying operation S3 may be an operation of removing the solvent from the resultant product obtained in the milling operation S2. In the drying operation S3, the solvent may be volatilized by using a heating element like a hot plate, a heating coil, or a lamp.

The calcining operation S4 is a homogeneous step. In the drying operation S3, the solvent is removed, and a resultant product is in a state in which the first and second precursors are uniformly mixed. In the calcining operation S4, the first and second precursors are chemically bonded to form an ABO type single phase. The calcining operation S4 may be performed under a heat treatment atmosphere in which the ABO type single phases are not agglomerated with each other. For example, the calcining operation S4 may be performed at a temperature of about 700° C. for about 12 hours in a furnace of an ambient air atmosphere. After the completion of the calcining operation S4, the resultant product is sufficiently cooled and removed from the furnace. For example, the resultant product may be cooled in the furnace until the resultant product reaches a temperature in which the product may be held.

The compacting operation S5 is an operation of molding the resultant product produced in the calcining operation S4 in a mold of a given shape, for example, a pellet shape, by applying pressure. In the compacting operation S5, the pressure applied to the material filled in the mold may be a relatively low pressure, for example, the pressure applied to the material filled in the mold may be applied by a human hand.

In this way, the pressure applied to the material filled in the mold in the compacting operation S5 may be not large, and thus, the material separated from the mold after the compacting operation S5 may include pores.

The CIP operation S6 includes an operation of compressing the resultant product that has undergone the compacting operation S5 at high pressure. As an example, the resultant product (pellet) obtained in the compacting operation S5 may be compressed at pressure of 200 MPa or greater. Some of the pores may be removed from the pellet through the CIP operation S6, and a relative density of the pellet that has undergone the CIP operation S6 may be about 60% compared to a fully dense example (e.g., a monocrystalline example without voids and defects) of the ternary paraelectric.

The SPS operation S7 includes an operation of sintering the resultant product of the CIP operation S6 at a given temperature while compressing at high pressure. In the SPS operation S7, the resultant product may be compressed with pressure of about 50 MPa. In the SPS operation S7, a sintering temperature may be, for example, about 900° C., but is not limited thereto. In the SPS operation S7, the sintering may be performed for about 5 minutes in a vacuum atmosphere. Through the SPS operation S7, the pores in the resultant product obtained in the CIP operation S6 may be removed as much as possible.

In another example, the SPS operation S7 may include an operation of sintering powder obtained through the calcining operation S4 under the condition of temperature and pressure described above after placing the powder into a graphite mold.

The re-heating operation S8 is to remove defect or oxygen vacancies that may be in the resultant product of the SPS operation S7, and may be, for example, an annealing process. The defect or oxygen vacancies may occur as the SPS operation S7 is performed in a reducing atmosphere.

The re-heating operation S8 may be performed at a higher temperature than the SPS operation S7, for example, may be at about 1000° C. The re-heating operation S8 may be performed for about 12 hours under an ambient air atmosphere.

For example, the relative density of $Na_2Nb_4O_{11}$ manufactured by the first method may be 99% or more compared to the fully dense example of $Na_2Nb_4O_{11}$ not containing a pore. For example, the relative density may be 99.5% or more.

Figure 2:
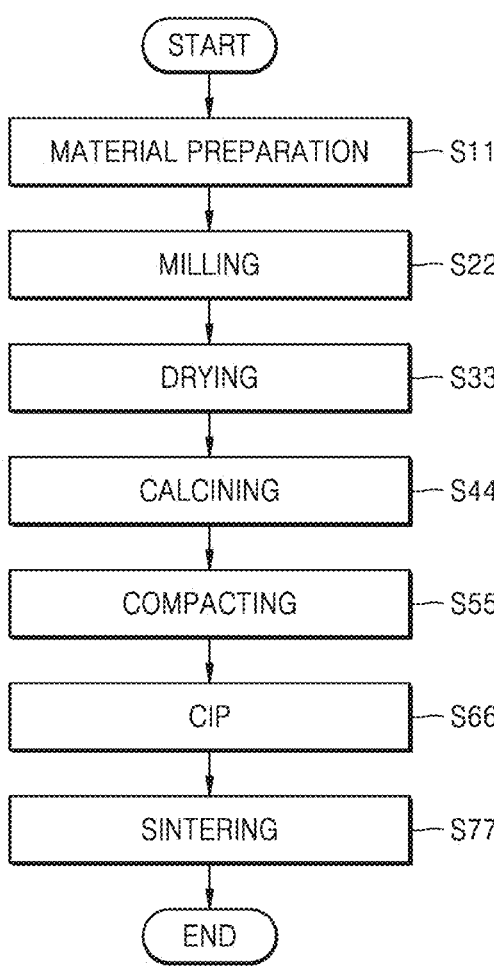
FIG. 2 is a flowchart illustrating a method of manufacturing $Na_2Nb_4O_{11}$, which is an example of a ternary paraelectric having a Cc structure, according to another embodiment.

FIG. 2 is a flowchart showing operations of a method (hereinafter, a second method) of manufacturing $Na_2Nb_4O_{11}$, which is an example of a ternary paraelectric having a Cc structure, according to another embodiment. Only parts different from the first method in FIG. 1 will be described.

Referring to FIG. 2, the second method may include a material preparation operation S11, a milling operation S22, a drying operation S33, a calcining operation S44, a compacting operation S55, a CIP operation S66 and a sintering operation S77. The material preparation operation S11 to the CIP operation S66 may be performed in the same manner as the material preparation operation S1 to the CIP operation S6 of FIG. 1. The sintering operation S77 is an operation of sintering a resultant product (for example, $Na_2Nb_4O_{11}$) of the CIP operation S66 in a given heat treatment atmosphere. Through the sintering operation S77, pores remaining in the resultant product that has undergone the CIP operation S66 may further be reduced. Accordingly, a relative density of the resultant product compared to a fuilly dense example of the target ternary paraelectric (e.g., $Na_2Nb_4O_{11}$) may be increased to 90% or more through the sintering operation S77, for example, the relative density of $Na_2Nb_4O_{11}$ after the sintering operation S77 is about 95%. A temperature of the heat treatment atmosphere of the sintering operation S77 may be, for example, about 1075° C., but the temperature is not limited thereto. The heat treatment may be maintained for about 12 hours in an ambient air atmosphere.

On the other hand, in the first and second methods described above, powder for sintering may be manufactured by a solid phase method, but may be manufactured by other methods besides the solid phase method, for example, a liquid phase method.

On the other hand, in $Na_2Nb_4O_{11}$ manufactured according to the manufacturing methods of FIGS. 1 and 2, Na may be replaced by another element that belongs to the same Group 1 as Na in the periodic table (e.g., an alkali metal), and Nb may be replaced by another element that belongs to the same Group 5 as Nb. As a result, the manufacturing methods of FIGS. 1 and 2 may be extended to a method of manufacturing a paraelectric material of the type $A_2B_4O_{11}$. "A" in $A_2B_4O_{11}$ may be an element belonging to Group 1 of the periodic table, for example, Na, K, Li or Rb. "B" may be an element belonging to Group 5 of the periodic table, for example Nb, V or Ta.

Next, physical characteristics of an example ($Na_2Nb_4O_{11}$) of the ternary paraelectric manufactured by using the first method of FIG. 1 and the second method of FIG. 2 will be described.

Figure 3:
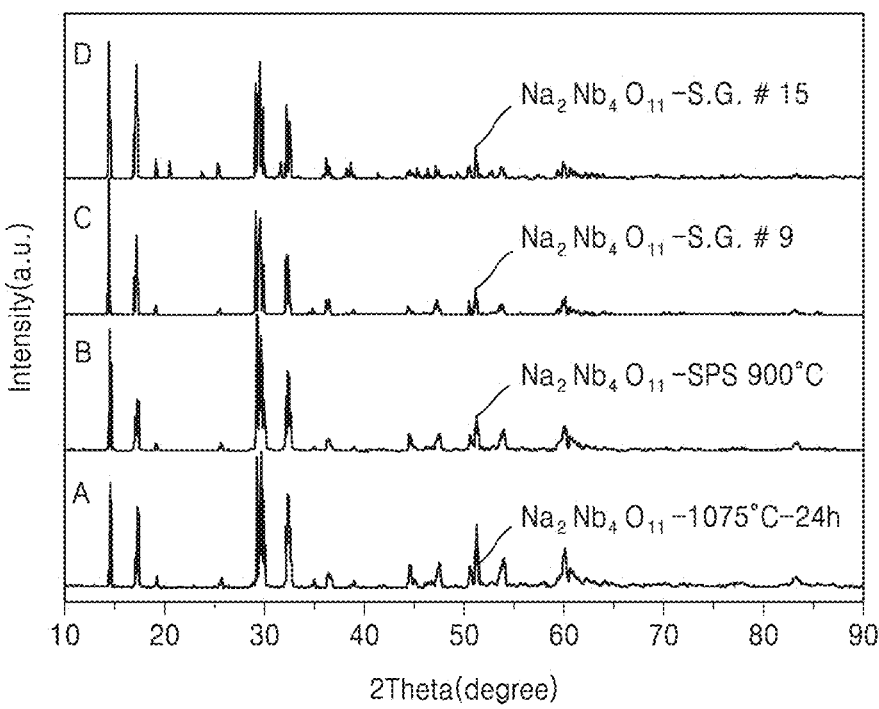
FIG. 3 is a graph showing X-ray diffraction characteristics of first $Na_2Nb_4O_{11}$ manufactured by using the method of FIG. 1; second $Na_2Nb_4O_{11}$ manufactured by using the method of FIG. 2; third $Na_2Nb_4O_{11}$ that is derived from a simulation calculation and has a monoclinic system and a space group No. 9; and fourth $Na_2Nb_4O_{11}$ that is derived from a simulation calculation and has a monoclinic system and a space group No. 15.

FIG. 3 is a graph showing X-ray diffraction characteristics of first $Na_2Nb_4O_{11}$ ("B") manufactured by using the method of FIG. 1; second $Na_2Nb_4O_{11}$ ("A") manufactured by using the method of FIG. 2; third $Na_2Nb_4O_{11}$ ("C") that is derived from a simulation calculation and has a monoclinic system and a space group No. 9; and fourth $Na_2Nb_4O_{11}$ ("D") that is derived from a simulation calculation and has a monoclinic system and a space group No. 15.

In FIG. 3, "A" represents X-ray diffraction characteristics of the second $Na_2Nb_4O_{11}$, and "B" represents X-ray diffraction characteristics of the first $Na_2Nb_4O_{11}$. "C" and "D" respectively represent X-ray diffraction characteristics of the third $Na_2Nb_4O_{11}$ and the fourth $Na_2Nb_4O_{11}$.

Referring to FIG. 3, the X-ray diffraction characteristics B and A of the first and second $Na_2Nb_4O_{11}$ are the same, and the X-ray diffraction characteristics B and A of the first and second $Na_2Nb_4O_{11}$ are the same as the X-ray diffraction characteristic C of the third $Na_2Nb_4O_{11}$. That is, when the peak distributions appearing in the X-ray diffraction characteristics B and A of the first $Na_2Nb_4O_{11}$ and the second $Na_2Nb_4O_{11}$ and the peak distributions appearing in the X-ray diffraction characteristic C of the third $Na_2Nb_4O_{11}$ are compared, it may be seen that the peak distribution appearing in the X-ray diffraction characteristics B and A of the first $Na_2Nb_4O_{11}$ and the second $Na_2Nb_4O_{11}$ and the peak distribution appearing in the X-ray diffraction characteristic C of the third $Na_2Nb_4O_{11}$ are the same. Accordingly, the peaks appearing in the X-ray diffraction characteristics B and A of the first and second $Na_2Nb_4O_{11}$ may be matched one-to-one with the peaks appearing in the X-ray diffraction characteristic C of the third $Na_2Nb_4O_{11}$.

On the other hand, it may be seen that the X-ray diffraction characteristics B and A of the first and second $Na_2Nb_4O_{11}$ are different from the X-ray diffraction characteristics D of the fourth $Na_2Nb_4O_{11}$. That is, the peak distribution appearing in the X-ray diffraction characteristics D of the fourth $Na_2Nb_4O_{11}$ is different from the peak distribution appearing in the X-ray diffraction characteristics B and A of the first $Na_2Nb_4O_{11}$ and the second $Na_2Nb_4O_{11}$. In detail, the peak distribution appearing in the X-ray diffraction characteristic D of the fourth $Na_2Nb_4O_{11}$ includes peaks that are not present in the peak distribution appearing in the X-ray diffraction characteristics B and A of the first $Na_2Nb_4O_{11}$ and the second $Na_2Nb_4O_{11}$. Accordingly, the peaks appearing in the X-ray diffraction characteristics B and A of the first $Na_2Nb_4O_{11}$ and the second $Na_2Nb_4O_{11}$ do not match one-to-one with the peaks appearing in the X-ray diffraction characteristics D of the fourth $Na_2Nb_4O_{11}$.

The results of FIG. 3 denote that the first $Na_2Nb_4O_{11}$ manufactured by the first method and the second $Na_2Nb_4O_{11}$ manufactured by the second method both are a monoclinic system and have a single phase in space group No. 9. That is, it may be determined that $Na_2Nb_4O_{11}$ having the space group No. 9 with the monoclinic system is synthesized by the first and second methods.

Figure 4:
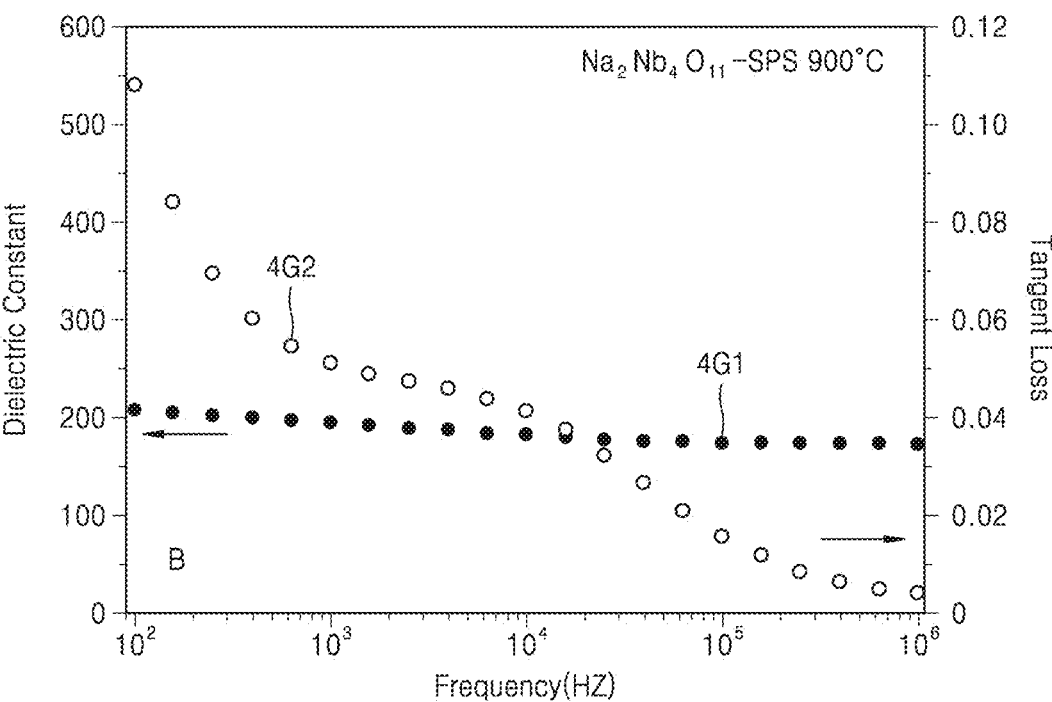
FIG. 4 is a graph showing a dielectric constant and a dielectric loss characteristic with respect to frequency change of a ternary paraelectric having a Cc structure according to an embodiment, wherein the ternary paraelectric may be the first $Na_2Nb_4O_{11}$ manufactured by using the first method of FIG. 1.

FIG. 4 is a graph showing a dielectric constant and a dielectric loss characteristic with respect to frequency change of a ternary paraelectric having a Cc structure according to an embodiment, wherein the ternary paraelectric may be the first $Na_2Nb_4O_{11}$ manufactured by using the first method of FIG. 1.

In FIG. 4, the horizontal axis represents applied frequency, the left vertical axis represents dielectric constant, and the right vertical axis represents dielectric loss. The first graph 4G1 represents dielectric constant, and the second graph 4G2 represents dielectric loss.

Referring to FIG. 4, in the case of the first $Na_2Nb_4O_{11}$, the dielectric constant tends to be substantially constant regardless of frequency. In a high frequency band ($10^4$ Hz~), the dielectric constant of the first $Na_2Nb_4O_{11}$ is about 170.

Figure 5:
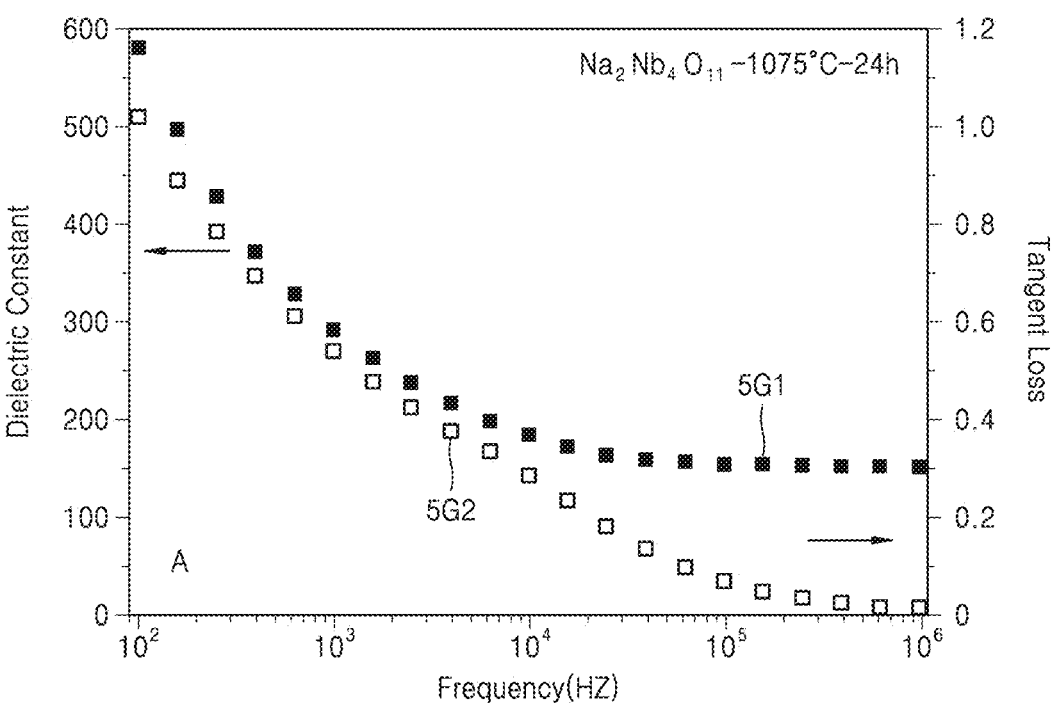
FIG. 5 is a graph showing a dielectric constant and a dielectric loss characteristic with respect to frequency change of a ternary paraelectric having a Cc structure according to another embodiment, wherein the ternary paraelectric may be the second $Na_2Nb_4O_{11}$ manufactured by using the second method of FIG. 2.

FIG. 5 is a graph showing a dielectric constant and a dielectric loss characteristic with respect to frequency change of a ternary paraelectric having a Cc structure according to another embodiment, wherein the ternary paraelectric may be the second $Na_2Nb_4O_{11}$ manufactured by using the second method of FIG. 2.

In FIG. 5, the horizontal axis represents applied frequency, the left vertical axis represents dielectric constant, and the right vertical axis represents dielectric loss. The first graph 5G1 represents dielectric constant, and the second graph 5G2 represents dielectric loss.

Referring to FIG. 5, the dielectric constant of the second $Na_2Nb_4O_{11}$ has a frequency dependency in a relatively low frequency band ($10^2$ to $10^4$ Hz). However, it may be seen that the dielectric constant of the second $Na_2Nb_4O_{11}$ is maintained at about 150 in a high frequency band of $10^4$ Hz or more.

Generally, when measuring an intrinsic dielectric property of a paraelectric, in order to remove a process defect or an effect of space charge, the measurement of the dielectric property is performed in a high frequency band ($10^5$-$10^6$ Hz) Therefore, a dielectric constant value in a high frequency band is important.

The results of FIGS. 4 and 5 denote that, in the case of a ternary dielectric manufactured according to the first and second methods, a dielectric constant of at least 150 or above may be constantly maintained in a high frequency band. In an example, the dielectric constant of a ternary dielectric manufactured by the first and second methods may be about 150 to about 250. When dielectric loss in a high frequency band is reviewed, it may be seen from FIG. 4 that the dielectric loss of a ternary dielectric manufactured according to the first method is 1% or less. When the second graphs 4G2 and 5G2 of FIGS. 4 and 5 are compared, the dielectric loss of the ternary dielectric manufactured according to the second method is greater than that of the ternary dielectric manufactured according to the first method. However, the dielectric loss of the ternary dielectric manufactured according to the second method does not exceed 10%.

On the other hand, as shown in FIGS. 4 and 5, the dielectric constant characteristics of the first $Na_2Nb_4O_{11}$ and the second $Na_2Nb_4O_{11}$ are different from each other and the dielectric constant values in the high frequency band are also different from each other. This result seems to be due to the difference in relative density of the first $Na_2Nb_4O_{11}$ and the second $Na_2Nb_4O_{11}$.

Table 1 summarizes the dielectric constant and dielectric loss characteristics of the first $Na_2Nb_4O_{11}$ and the second $Na_2Nb_4O_{11}$ in a high frequency band ($10^5$ Hz and $10^6$ Hz). Table 1 is a result measured at room temperature.

TABLE 1

| | $10^5$ Hz | | $10^6$ Hz | |
|---|---|---|---|---|
| sample | dielectric constant K | dielectric loss | dielectric constant K | dielectric loss |
| First $Na_2Nb_4O_{11}$ | 173.5 | 0.01 | 172.1 | 0.003 |
| Second $Na_2Nb_4O_{11}$ | 154.5 | 0.06 | 151.9 | 0.009 |

Figure 6:
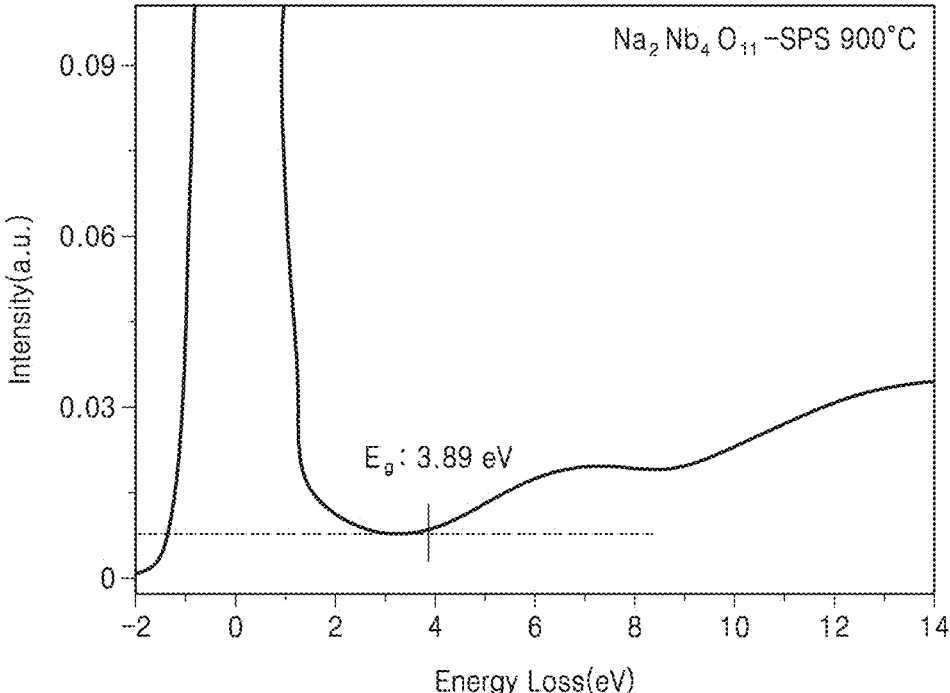
FIG. 6 is a graph showing an analysis result of bandgap energy of the first $Na_2Nb_4O_{11}$ manufactured by the method of FIG. 1 as a ternary paraelectric having a Cc structure according to an embodiment.

FIG. 6 is a graph showing an analysis result of bandgap energy of the first $Na_2Nb_4O_{11}$ manufactured by the first method of FIG. 1 as a ternary paraelectric having a Cc structure according to an embodiment. The analysis results were obtained by using reflection electron energy loss spectroscopy (REELS). In FIG. 6, the horizontal axis represents energy loss and the vertical axis represents intensity.

Referring to the analysis result of FIG. 6, the bandgap energy of the first $Na_2Nb_4O_{11}$ is about 3.89 eV, and this value is greater than the bandgap energy (~3 eV) of STO.

In order to prevent a leakage current from occurring in a dielectric for DRAM, a band offset with an electrode, for example, a TiN electrode mainly used in fields, is required to be maintained at 1 eV or more. In the case of STO, a band offset with TiN is about 0.93 eV, and thus, it is difficult to prevent the occurrence of a leakage current.

On the other hand, the bandgap energy of the first $Na_2Nb_4O_{11}$ is greater than that of STO as described with reference to FIG. 6. Therefore, in the case of the first $Na_2Nb_4O_{11}$, the band offset with the TiN electrode is determined to be 1 eV or more, and thus, the first $Na_2Nb_4O_{11}$ may be a new dielectric material that may be applied to a semiconductor device.

FIGS. 7A to 7D are graphs showing hysteresis characteristics of a ternary dielectric having a Cc structure (for example, the first $Na_2Nb_4O_{11}$) according to an embodiment.

Figure 7A:
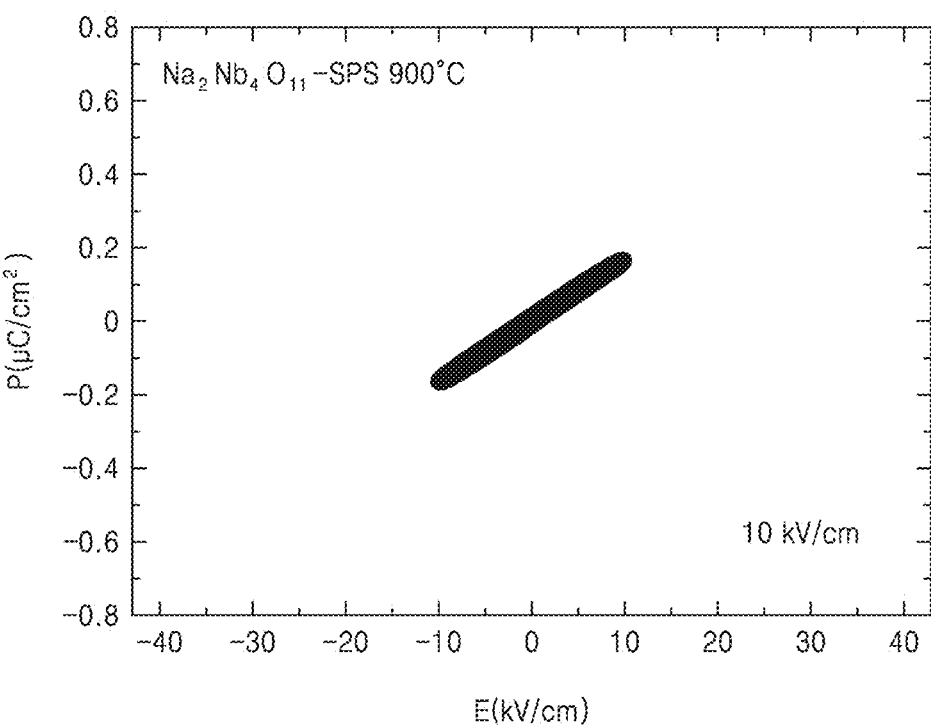
FIGS. 7A to 7D are graphs showing hysteresis of a ternary dielectric having a Cc structure according to an embodiment, that is, with respect to the first $Na_2Nb_4O_{11}$ manufactured by the first method of FIG. 1.

FIG. 7A shows a hysteresis characteristic of a ternary paraelectric when an electric field of –10 kV/cm to +10 kV/cm is applied to the ternary paraelectric.

Figure 7B:
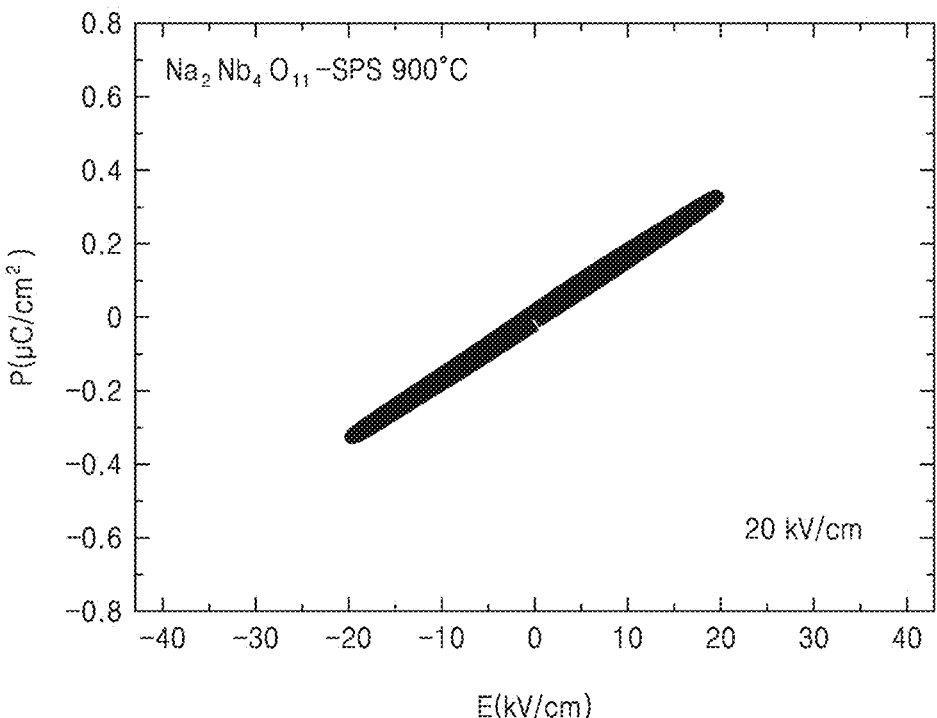

FIG. 7B shows a hysteresis characteristic of a ternary paraelectric when an electric field of –20 kV/cm to +20 kV/cm is applied to the ternary paraelectric.

Figure 7C:
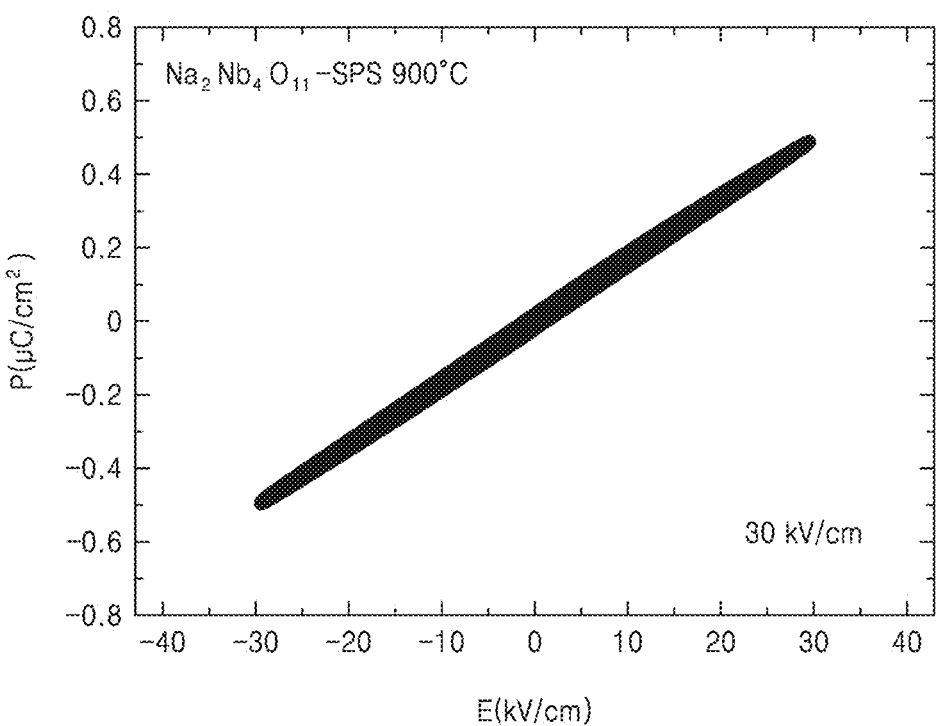

FIG. 7C shows a hysteresis characteristic of a ternary paraelectric when an electric field of –30 kV/cm to +30 kV/cm is applied to the ternary paraelectric.

Figure 7D:
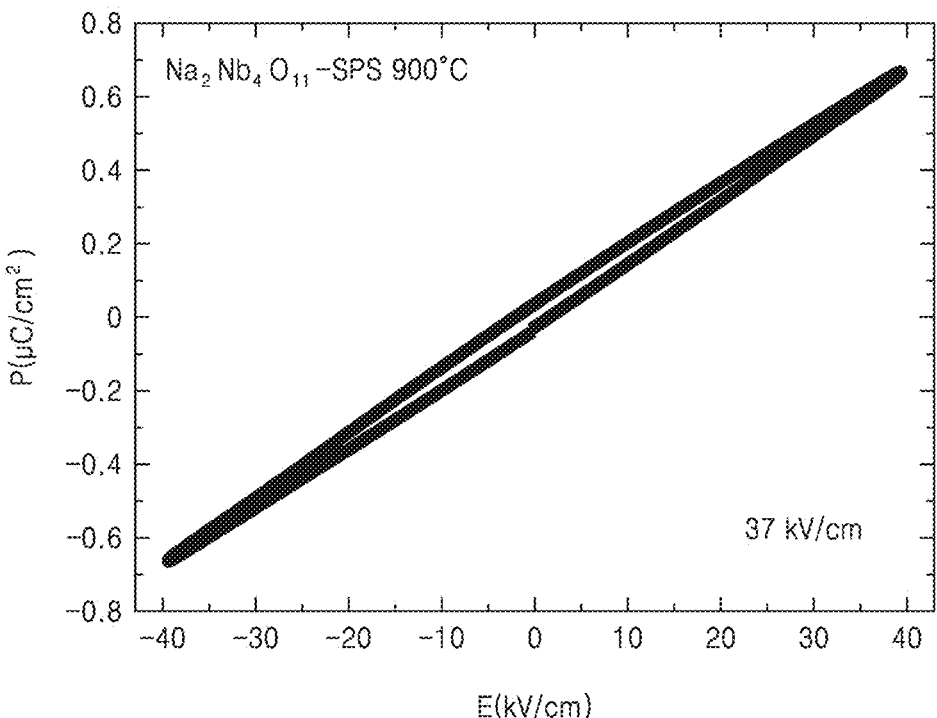

FIG. 7D shows a hysteresis characteristic of a ternary paraelectric when an electric field of –37 kV/cm to +37 kV/cm is applied to the ternary paraelectric.

In FIGS. 7A to 7D, the horizontal axis represents intensity of electric field according to an applied voltage, and the vertical axis represents polarization density.

Referring to FIGS. 7A to 7D, it may be seen that the hysteresis characteristics of the ternary paraelectric according to an embodiment are linear. That is, as the voltage applied to the ternary paraelectric according to an embodiment increases the polarization density of the ternary paraelectric increases. In other words, the polarization density linearly increases in proportion to a voltage applied to the ternary paraelectric.

The results may denote that the ternary paraelectric according to an embodiment, that is, the ternary dielectric manufactured by the first method of FIG. 1, is a paraelectric.

FIGS. 8A to 8D are graphs showing hysteresis characteristics of a ternary dielectric (for example, the second $Na_2Nb_4O_{11}$) according to an embodiment.

Figure 8A:
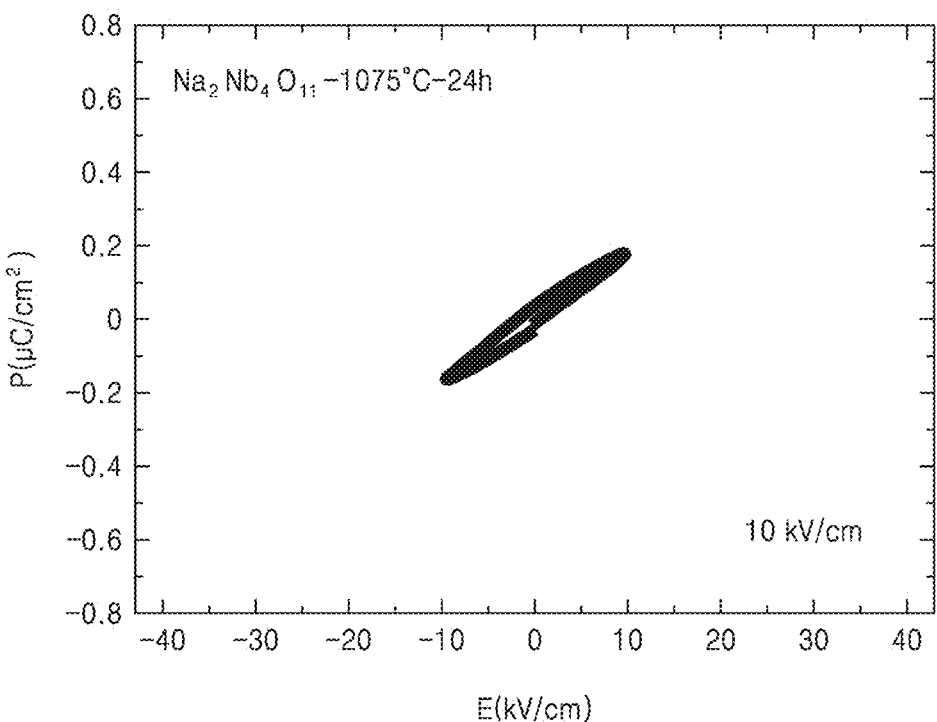
FIGS. 8A to 8D are graphs showing hysteresis of a ternary dielectric according to an embodiment, that is, with respect to the second $Na_2Nb_4O_{11}$ manufactured by the second method of FIG. 2.

FIG. 8A shows a hysteresis characteristic of a ternary paraelectric when an electric field of −10 kV/cm to +10 kV/cm is applied to the ternary paraelectric.

Figure 8B:
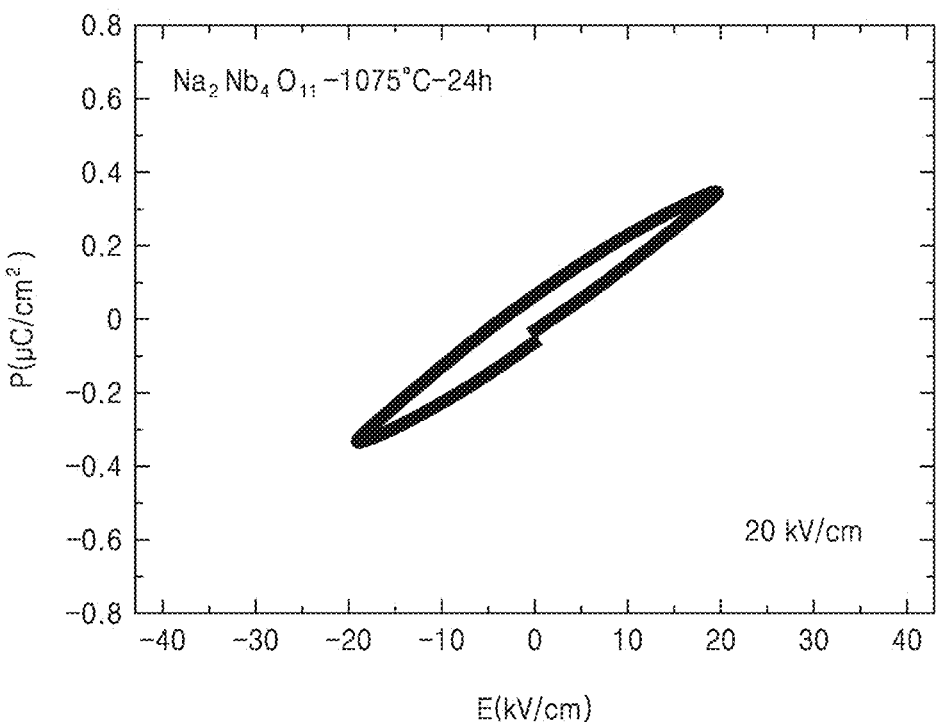

FIG. 8B shows a hysteresis characteristic of a ternary paraelectric when an electric field of −20 kV/cm to +20 kV/cm is applied to the ternary paraelectric.

Figure 8C:
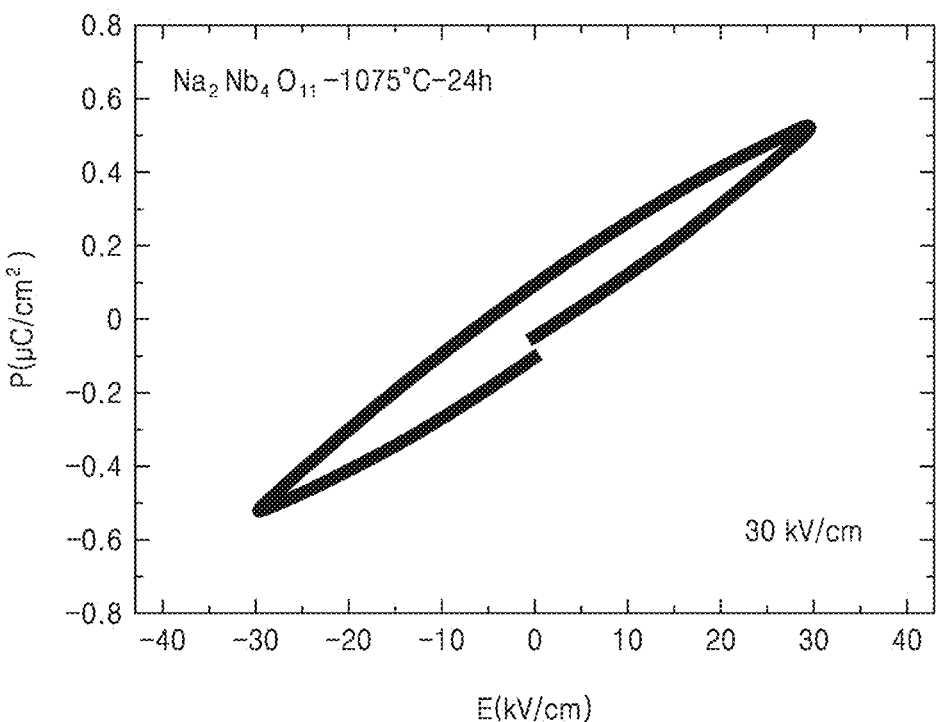

FIG. 8C shows a hysteresis characteristic of a ternary paraelectric when an electric field of −30 kV/cm to +30 kV/cm is applied to the ternary paraelectric.

Figure 8D:
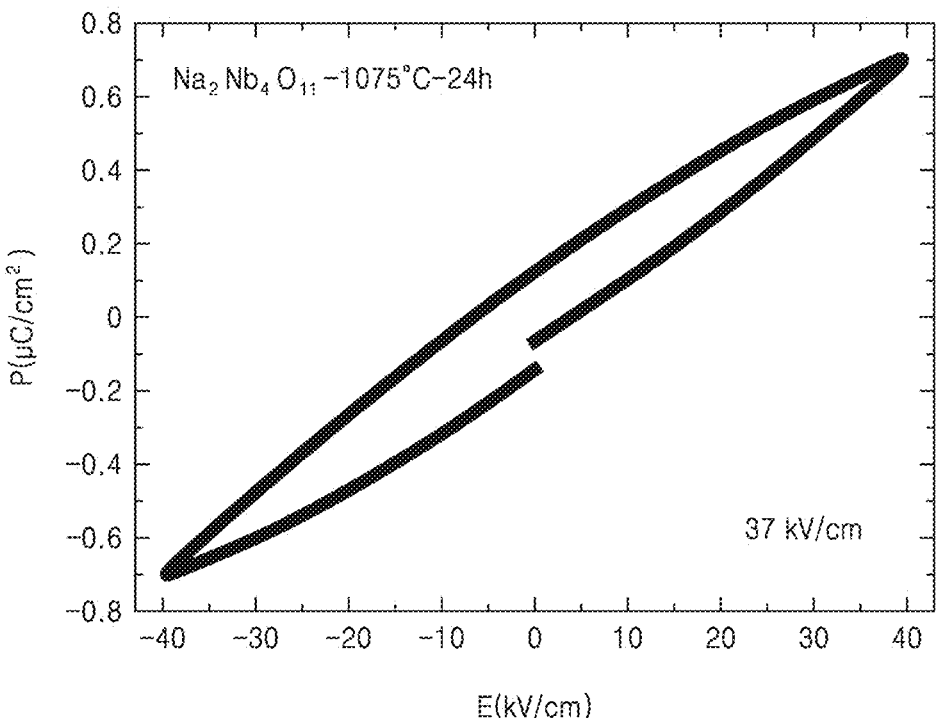

FIG. 8D shows a hysteresis characteristic of a ternary paraelectric when an electric field of −37 kV/cm to +37 kV/cm is applied to the ternary paraelectric.

In FIGS. 8A to 8D, the horizontal axis represents intensity of electric field according to an applied voltage, and the vertical axis represents polarization density.

Referring to FIGS. 8A to 8D, as the voltage applied to the ternary paraelectric is increased, the polarization density of the ternary paraelectric is also increased. That is, a linear proportional relationship appears between the voltage applied to the ternary paraelectric and the polarization density.

The result denotes that the ternary dielectric formed by the second method of FIG. 2 is also a paraelectric.

When the linear property between the graphs of FIGS. 7A to 7D and the graphs of FIGS. 8A to 8D is compared, it may be seen that the linear property of the graphs of FIGS. 7A to 7D is superior to those of FIGS. 8A to 8D.

This result seems to be due to the difference between the relative density (more than 99%) of the ternary dielectric according to an embodiment and the relative density (more than 95%) of the ternary dielectric according to another embodiment.

A disclosed ternary paraelectric (for example, $Na_2Nb_4O_{11}$ in space group No. 9 that is a monoclinic system) having a Cc structure may have a permittivity greater than 100, a relative density of 90% or more, and a bandgap energy greater than that of the STO. Accordingly, when the disclosed ternary paraelectric is used, it is possible to minimize a leakage current while ensuring a high dielectric constant and thinning of the dielectric. Therefore, when the disclosed paraelectric is applied to DRAM, a leakage current may be reduced while ensuring sufficient capacitance for operating the DRAM.

As a result, the use of the disclosed paraelectric may help stabilize an operation of a semiconductor device, such as highly integrated DRAM, and may also help to increase the reliability of the semiconductor device.

Figure 9:
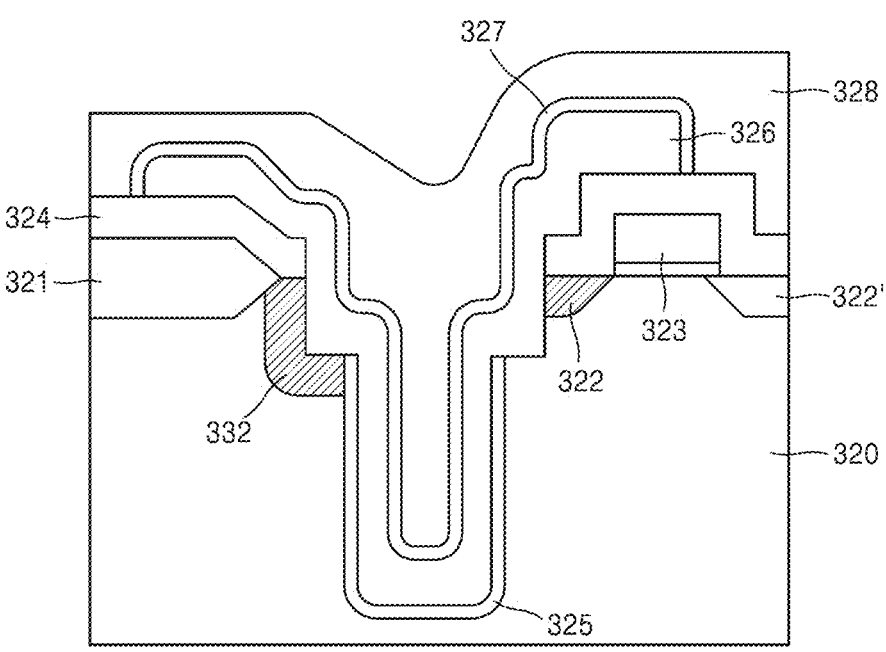
FIG. 9 illustrates a structure of a trench capacitor-type dynamic random access memory (DRAM).

FIG. 9 illustrates a structure of a trench capacitor-type dynamic random access memory (DRAM).

Referring to FIG. 9, on a P-type semiconductor substrate 320, a device isolation region may be defined with a field oxide film 321, and a gate electrode 323 and source/drain impurity regions 222 and 222' may be formed in the device isolation region. A high-temperature oxide (HTO) film may be formed as an interlayer insulating film 324. A region not to be a trench may be capped with a trench buffer layer, and a part of the source region 322 may be open to form a contact portion.

A trench is formed in a sidewall of the interlayer insulating film 324, and a sidewall oxide film 325 may be formed over the entire sidewall of the trench. The sidewall oxide film 325 may compensate for damage in the semiconductor substrate caused by etching to form the trench, and may also serve as a dielectric film between the semiconductor substrate 320 and a storage electrode 326. A sidewall portion of part of the source region 322, except for the other part of the source region near the gate electrode 323, may be entirely exposed.

A PN junction (not illustrated) may be formed in the sidewall portion of the source region by impurity implantation. The trench may be formed in the source region 322. A sidewall of the trench near the gate may directly contact the source region 322, and the PN junction may be formed by additional impurity implantation into the source region.

A storage electrode 326 may be formed on part of the interlayer insulating film 324, the exposed source region, and the surface of the sidewall oxide film 325 in the trench. The storage electrode may be, for example, a polysilicon layer, and may be formed so as to contact the entire source region 322 in contact with the upper sidewall of the trench, in addition to the part of the source region 322 near the gate electrode. The source region 322 on the outer surface of the upper sidewall of the trench may be enlarged due to the implanted impurities, and thus may more reliably contact the storage electrode 326. Next, an insulating film 327 as a capacity dielectric film may be formed along the upper surface of the storage electrode 326, and a polysilicon layer as a plate electrode 328 may be formed thereon, thereby completing a trench capacitor type DRAM. The ternary paraelectric according to the example embodiments may be used as the insulating film 327.

As the storage electrode 326, the polysilicon layer may be formed on the part of the interlayer insulating film 324, the exposed source region 322, and the surface of the sidewall oxide film 325 in the trench. Since the storage electrode 326 is formed to spontaneously contact, in addition to the part of the source region 322 near the gate electrode, the entire source region 322 in contact with the upper sidewall of the trench, the contact area may be enlarged, leading to more reliable contact with the storage electrode 326 and a significant increase in capacitance of the capacitor.

Though illustrated as part of a trench capacitor type DRAM, the example embodiments are not limited thereto. For example, the ternary paraelectric may comprise a insulating film in other DRAM types, or the insulating film in other electronic devices (e.g., the insulating film in a capacitor).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A ternary paraelectric having a Cc structure comprising:

a material that belongs to a monoclinic system, is space group No. 9, and has the X-ray diffraction characteristics shown in (A) of FIG. 3.

2. The ternary paraelectric of claim 1, wherein the material has a relation between frequency and a dielectric constant and a relation between frequency and a dielectric loss that are shown in FIG. 5.

3. The ternary paraelectric of claim 1, wherein the material has a chemical formula of $A_2B_4O_{11}$ and has a dielectric constant of 150 to 250, wherein "A" of the $A_2B_4O_{11}$ material is a Group 1 element, and "B" of the $A_2B_4O_{11}$ material is a Group 5 element.

4. The ternary paraelectric of claim 3, wherein "A" of the $A_2B_4O_{11}$ material comprises one of Na, K, Li and Rb and "B" of the $A_2B_4O_{11}$ material comprises one of Nb, V, and Ta.

5. The ternary paraelectric of claim 3, wherein the $A_2B_4O_{11}$ material comprises $Na_2Nb_4O_{11}$ in which a bandgap energy thereof is greater than that of STO.

6. The ternary paraelectric of claim 3, wherein a relative density of the $A_2B_4O_{11}$ material is 90% or more compared to a fully dense $A_2B_4O_{11}$ not containing a pore.

7. A capacitor comprising:

a first electrode;

a second electrode; and a dielectric layer, the dielectric layer comprising the ternary paraelectric having the Cc structure of claim 1.

8. A semiconductor device comprising the ternary paraelectric having the Cc structure of claim 1.

9. A method of manufacturing a ternary paraelectric having a Cc structure, the method comprising:

preparing ternary dielectric powder, the ternary dielectric powder comprising an $A_2B_4O_{11}$ material;

compacting the prepared ternary dielectric powder; and sintering the compacted ternary dielectric powder;

wherein the ternary paraelectric includes a material that belongs to a monoclinic system, is a space group No. 9 and has the X-ray diffraction characteristics shown in (A) of FIG. 3.

10. The method of claim 9, wherein the material has a dielectric constant of 150 to 250, "A" of the $A_2B_4O_{11}$ material is a Group 1 element, and "B" of the $A_2B_4O_{11}$ material is a Group 5 element.

11. The method of claim 9, further comprising re-heating a resultant product of the sintering.

12. The method of claim 11, wherein the sintering comprises a spark plasma sintering (SPS) operation.

13. The method of claim 11, wherein the re-heating is performed at a higher temperature than the sintering.

14. The method of claim 9, wherein the preparing of the ternary dielectric powder comprises:

mixing a first precursor including "A" of the $A_2B_4O_{11}$ material with a second precursor including "B" of the $A_2B_4O_{11}$ material;

milling the mixture of the first and second precursors after adding a solvent to the mixture;

drying a resultant product after the milling is completed; and calcining the dried resultant product.

15. The method of claim 14, wherein the milling comprises a planetary milling operation.

16. The method of claim 9, wherein the compacting comprises:

molding the ternary dielectric powder into a pellet shape; and compacting the molded ternary dielectric powder.

17. The method of claim 9, wherein "A" of the $A_2B_4O_{11}$ material is one of Na, K, Li, and Rb and "B" of the $A_2B_4O_{11}$ material is one of Nb, V, and Ta.

18. The method of claim 9, wherein the $A_2B_4O_{11}$ material comprises $Na_2Nb_4O_{11}$ in which bandgap energy thereof is greater than that of STO.

19. The method of claim 9, wherein a relative density of the $A_2B_4O_{11}$ material is 90% or more compared to a fully dense $A_2B_4O_{11}$ not containing a pore.

20. The method of claim 9, wherein the material has a relation between frequency and a dielectric constant and a relation between frequency and a dielectric loss that are shown in FIG. 5.

* * * * *